(12) United States Patent
Wohl et al.

(10) Patent No.: US 8,549,372 B2
(45) Date of Patent: Oct. 1, 2013

(54) ATPG AND COMPRESSION BY USING MAJORITY GATES

(75) Inventors: Peter Wohl, Williston, VT (US); John A. Waicukauski, Tualatin, OR (US)

(73) Assignee: Synopsys, Inc., Mountain View, CA (US)

(*) Notice: Subject to any disclaimer, the term of this patent is extended or adjusted under 35 U.S.C. 154(b) by 3 days.

(21) Appl. No.: 13/412,575

(22) Filed: Mar. 5, 2012

(65) Prior Publication Data

US 2013/0232459 A1    Sep. 5, 2013

(51) Int. Cl.
G01R 31/28    (2006.01)

(52) U.S. Cl.
USPC .............. 714/741; 714/738; 703/4; 703/13; 703/14; 703/15

(58) Field of Classification Search
None
See application file for complete search history.

(56) References Cited

U.S. PATENT DOCUMENTS

| 7,514,964 B2 * | 4/2009 | Fijany et al. .................. 326/104 |
| 2011/0231805 A1 | 9/2011 | Wohl et al. |

OTHER PUBLICATIONS

Ibrahim, Walid, et al. "On the Reliability of Majority Gates Full Adders", IEEE Transactions on Nanotechnology, vol. 7, No. 1, Jan. 2008, pp. 56-67.*
KARtM, Faizal, et at. "Testing of Combinational Majority and Minority Logic Networks", IEEE 14th International Mixed-Signals, Sensors, and Systems Test Workshop, Vancouver, BC, Jun. 18-20, 2008, pp. 1-6.*

Al-Yamani, Ahmad, et al. "Test Quality for High Level Structural Test", 9th IEEE International High-Level Design Validation and Test Workshop, Nov. 10-12, 2004, pp. 109-114.
Amarel, S., et al. "Majority Gate Networks", IEEE Transactions on Electronic Computers, Feb. 1964, pp. 4-13.
Anderson, Douglas A., et al. "Design of Totally Self-Checking Check Circuits for m-Out-of-n Codes", IEEE Transactions on Computers, vol. C-22, No. 3, Mar. 1973, pp. 263-269.
Balakrishnan, Kedarnath J., et al. "Relationship Between Entropy and Test Data Compression", IEEE Transactions on Computer-Aided Design of Integrated Circuits and Systems. vol. 26, No. 2, Feb. 2007, pp. 386-395.
Cai, X., et al. "Highly Efficient Parallel ATPG Based on Shared Memory", International Test Conference, 2010 IEEE, Paper 12.2, 7 pages.
Efthymiou, Aristides, et al. "Redundancy and Test-Pattern Generation for Asynchronous Quasi-Delay-Insensitive Combinational Circuits", IEEE Design and Diagnostics of Electronic Circuits and Systems, Apr. 11-13, 2007, 6 pages.
Fujiwara, Hideo, et al. "On the Acceleraton of Test Geneation Algorthms", IEEE Transacions on Computers, vol. C-32, No. 12, Dec. 1983, pp. 1137-1144.
Gupta, Pallav, et al. "A Test Generation Framework for Quantum Cellular Automata Circuits", IEEE Transactions on Very Large Scale Integration (VLSI) Systems, vol. 15, No. 1, Jan. 2007, pp. 24-36.
Ibrahim, Walid, et al. "On the Reliability of Majority Gates Full Adders", IEEE Transactions on Nanotechnology, Vol, 7, No. 1, Jan. 2008, pp. 56-67.

(Continued)

Primary Examiner — John Trimmings
(74) Attorney, Agent, or Firm — Bever, Hoffman & Harms, LLP; Jeanette S. Harms

(57) ABSTRACT

A method to increase automatic test pattern generation (ATPG) effectiveness and compression identifies instances of "majority gates" and modifies test generation to exploit their behavior so that fewer care bit are needed. This method can increase test coverage and reduce CPU time as previously aborted faults are now tested. The majority gate enhanced ATPG requires no hardware support and can be applied to any ATPG system.

26 Claims, 13 Drawing Sheets

(56) References Cited

OTHER PUBLICATIONS

Karim, Faizal, et al. "Testing of Combinational Majority and Minority Logic Networks", IEEE 14th International Mixed-Signals, Sensors, and Systems Test Workshop, Vancouver, BC, Jun. 18-20, 2008, pp. 1-6.

Lam, Wai Kit, et al. "Binary sorter by majority gate", Electronics Letters, vol. 32, No. 15, Jul. 18, 1996, pp. 1357-1358.

Sarfert, Thomas M., et al. "A Hierarchical Test Pattern Generation System Based on High-Level Primitives", IEEE Transactions on Computer-Aided Design, vol. 11, No. 1, Jan. 1992, pp. 34-44.

Schulz, Michael H., et al. "Advanced Automatic Test Pattern Generation and Redundancy Identification Techniques", 18th International Symposium on Fault-Tolerant Computing, Jun. 27-30, 1988, pp. 30-35.

Wohl, Peter, et al. "Fully X-tolerant, Very High Scan Compression", DAC 2010, Jun. 13-18, 2010, Anaheim, California, USA, pp. 362-367.

Wohl, Peter, et al. "Increasing PRPG-based Compression by Delayed Justification", International Test Conference, 2010 IEEE, Paper 9.1, pp. 1-10.

\* cited by examiner

```
                for all gates g                                    410
    (402)   if (type(g) not in Otype) continue (403)   gout= g initalize input_list {i1,i2,i3} = {}

(404)   for all input gates ig of gout
                if (fanout(ig) > 1 ‖ type(ig) not in INTtype ‖
                    adding inputs of ig would exceed 3 unique inputs)
                    add ig to input_list
                else recursively analyze inputs of ig
            end (406)   if (input_list contains exactly 3 unique gates)
                {i1,i2,i3} = input_list; candidate = {i1,i2,i3,gout}
```

1200

Identify candidate majority gates of an IC design
1201

For each identified candidate majority gate, simulate the output based on predetermined bit values assigned to the inputs and propagated through the library cells of the candidate majority gate
1202

Modify ATPG based on confirmed majority gates
1203

FIG. 12

ATPG AND COMPRESSION BY USING MAJORITY GATES

BACKGROUND OF THE INVENTION

1. Field of the Invention

The present invention relates to automatic test pattern generation (ATPG) for testing integrated circuits (ICs), and in particular to improving ATPG and compression techniques by using majority gates.

2. Related Art

Larger and more complex logic designs in integrated circuits (ICs) lead to demands for more sophisticated testing to ensure fault-free performance of the resulting ICs. This testing can represent a significant portion of the design, manufacture, and service cost of ICs. In a simple model, testing of an IC design can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic values through the scan cells. Thus, if the longest scan chain includes 500 scan cells, then at least 500 clock cycles are used to complete the loading process. Note that, in actual embodiments, software can compensate for different scan chain lengths, thereby ensuring that outputs from each test pattern are recognized and analyzed accordingly.

The test patterns for the scan chains can be generated using an external testing device. Using such a device, an exhaustive test can be done by applying $2^N$ input patterns to a design with N inputs and scan cells, wherein N is a positive integer. However, this test approach is commercially impractical as the number of inputs increases.

To solve this problem, deterministic automatic test pattern generation (ATPG) can be used to generate a smaller set of patterns while providing fault coverage close to 100%. Specifically, in deterministic ATPG, each test pattern is designed to test for as many faults as possible. However, even with the reduction in test patterns, deterministic ATPG patterns still require significant storage area in the test-application equipment (tester) for the large number of patterns that are input directly to the scan chains, and for the expected output values from the scan chains. Indeed, higher compacted vector sets generated with modern scan-based ATPG now require on-chip compression/decompression to reduce test cost.

Although ATPG tools are very efficient in merging multiple fault into a single test pattern, only a small percentage of inputs are set. These "care bits" can include some primary inputs, but are mostly scan cells. In regular scan testing, all other inputs are assigned random values and the entire test vector is loaded onto the tester. Compression schemes can store the care bits and fill-in other bits through on-chip decompression hardware when the test is applied.

Reducing the care bits needed for a tester can advantageously enhance ATPG effectiveness. Scan load compression methods that encode only care bits, such as pseudorandom pattern generation (PRPG) compression, benefit directly if the number of care bits can be reduced. For example, the maximum possible load data compression has been associated with the number of care bits in ATPG-generated test cubes. Consequently, the encoding efficiency (i.e. the ratio between the number of care bits in the test cube and bits stored on the tester) has been steadily improved. Notably, even the number of care bits needed to test a given faults set can be reduced when employing certain ATPG compression techniques.

Therefore, a need arises for a method that can improve ATPG effectiveness as well as increase PRPG-based compression.

SUMMARY OF THE INVENTION

A method to enhance ATPG effectiveness, i.e. provide higher coverage, fewer patterns, and faster CPU times, as well as increase PRPG-based compression is provided. The method includes identifying candidate majority gates of an integrated circuit design, wherein each candidate majority gate includes a plurality of library cells. The candidate majority gate has an odd number of inputs and one output, which has the Boolean value of the majority of the inputs. For each identified candidate majority gate, the output can be simulated based on predetermined bit values assigned to the inputs and considering all potential input inversions and propagated through the plurality of library cells. This simulating can determine whether the identified candidate majority gate is a confirmed majority gate. ATPG can be modified based on the confirmed majority gates.

Identifying of the candidate majority gates can include defining predetermined library cells for majority gate outputs and then identifying possible candidate majority gates based on the predetermined library cells. In one embodiment, a set of output gate (Otype) library cells can be defined as {AND, NAND,OR,NOR,XOR,XNOR,MUX}, and a set of internal gate library cells (INTtype) can be defined as {BUF,INV, Otype}. For each possible candidate majority gate, at least one of the following must be true to identify a candidate majority gate: an input gate has a fanout greater than one, the input gate is not in INTtype, and analysis of the possible candidate majority gate yields exactly N unique input gates, wherein N is an odd integer greater than one.

Simulating the output can include recording whether the confirmed majority gate is a non-inverted majority gate or an inverted majority gate based on the output. When a first set of predetermined bit values does not confirm that the identified candidate majority gate is a confirmed majority gate, then at least some of the first set of predetermined bit values can be inverted. At this point, the output can be re-simulated. In one embodiment, the output can be re-simulated considering all possible combinations of input inversions, wherein when neither a non-inverted majority gate nor an inverted majority gate is confirmed, then the identified candidate gate is indicated as not being a majority gate.

Modifying the ATPG can include sensitizing a fault through one input gate of a confirmed majority gate to its output. This sensitizing can include placing non-path inputs at opposite values, the non-path inputs being any path input other than a path input associated with the fault. In one embodiment, cascaded majority gates can also be identified.

In this embodiment, sensitizing the fault can be done through one input gate of at least one majority gate to its output, wherein at least one other input connects to another majority gate.

A non-transitory, computer-readable medium storing computer-executable instructions for improving testing of a design of an integrated circuit is also provided. These instructions, when executed by a computer, can perform the steps described above.

BRIEF DESCRIPTION OF THE DRAWINGS

FIG. 12 illustrates a technique for improving the performance of a tester using confirmed majority gates.

DETAILED DESCRIPTION OF THE DRAWINGS

Figure 1:
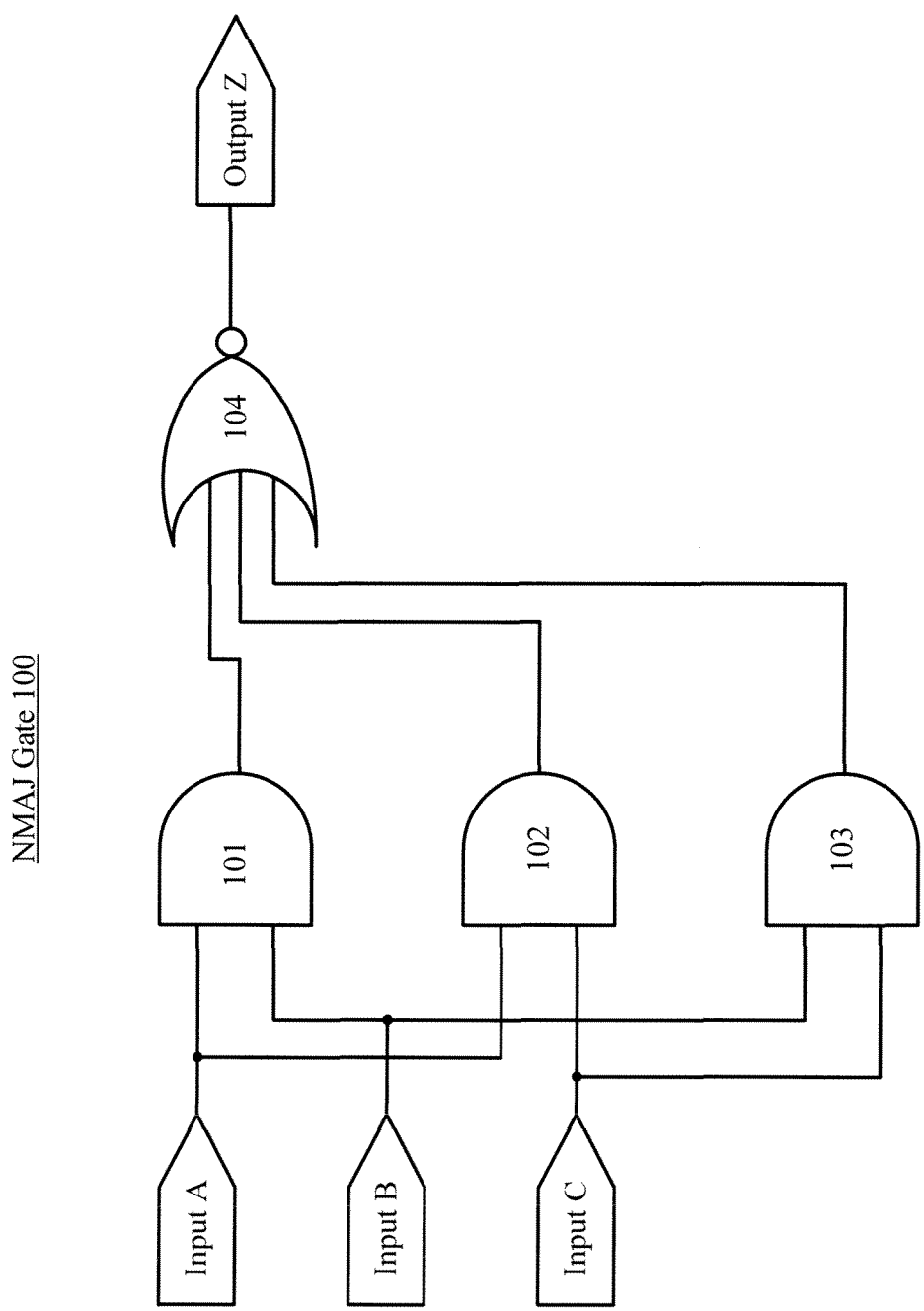
FIG. 1 illustrates an exemplary inverting majority gate that performs a sum of products.

A method to increase test effectiveness and compression can identify instances of "majority gates" and then modify test generation to exploit their behavior so that fewer care bit are needed to be described. A "majority gate" is a combinational 1-output logic circuit with an odd number of inputs where the output has the Boolean value of the majority of inputs. Other inputs can be at any value (including unknown "X"). The smallest majority gate, i.e. a 3-input circuit, can be described as a sum of simple products. For example, $$Z=(A*B)+(B*C)+(A*C)$$

where Z is the output of the majority gate, A, B, and C are inputs to the majority gate, "*" represents a logic AND operation, and "+" represents a logic OR operation.

Majority gates may be used in high-performance ICs. For instance, a full adder implemented with majority gates is more reliable than a full adder implemented with standard XOR gates. Moreover, a binary sorter implemented with majority gates requires fewer gates than the conventional implementation. Some checker designs rely on the use of majority detection circuits. Indeed, various circuit implementations with majority gates are becoming increasingly preferred to other implementations.

Note that although the example majority gates described hereafter are 3-input circuits, a majority gate may have other odd number of inputs, e.g. 5, 7, 9, etc. Therefore, the described circuits hereafter are exemplary only and not limiting.

As described in further detail below, the method uses majority gates to improve the basic test vectors for stuck-at faults in IC designs. In one embodiment, faults inside the majority gate structures can use traditional ATPG techniques until the control and observe points reach the boundary of the majority gate. Using high-level gates can make ATPG faster and reduce the size of the test set generated. However, using only the complex gates nodes as fault sites, instead of elementary gates, results in significantly lower test quality. Therefore, in one embodiment, majority gate ATPG can retain all faults on low-level gates. That is, the majority gates are used solely to guide the test generator towards better decisions.

Note that the majority function is found in most IC designs, although typically not in a single library cell. Thus, identifying majority gates cannot rely on high-level primitive information extracted from the netlist. However, as described in further detail below, candidate majority gates can be identified based on low-level primitives (e.g., AND, OR, etc.) and then confirmed using another technique.

TABLE 1 defines exemplary three-input (generically A, B, and C) majority gates (by definition one-output (generically Z)) based on their inputs and functions, wherein "?" is 0, 1, or X. Two types of majority gates are described herein: MAJ and inverted MAJ (NMAJ). The function of the A gate is the same as the MAJ gate with all inputs inverted (i.e. $0 \rightarrow 1$ and $1 \rightarrow 0$).

TABLE 1

DEFINITION OF MAJORITY GATES

| Input A | Input B | Input C | Output Z (MAJ) | Output Z (NMAJ) |
|---|---|---|---|---|
| ? | 0 | 0 | 0 | 1 |
| 0 | ? | 0 | 0 | 1 |
| 0 | 0 | ? | 0 | 1 |
| ? | 1 | 1 | 1 | 0 |
| 1 | ? | 1 | 1 | 0 |
| 1 | 1 | ? | 1 | 0 |

FIG. 1 illustrates an exemplary NMAJ gate 100 that performs a sum of products. NMAJ gate 100 (form "X") is built out of three two-input AND library cells 101, 102, and 103 (also called primitives in the context of the library), and one three-input NOR library cell 104. Note that top-level (also called primary) inputs A, B, C and top-level output Z do not exist in the real design, and are only shown here for illustration. Rather, cells 101-104 are somewhere in a sea of interconnected cells. For purposes of identifying a majority gate, inputs A, B, and C are called input gates and output Z is called an output gate herein.

Figure 2:
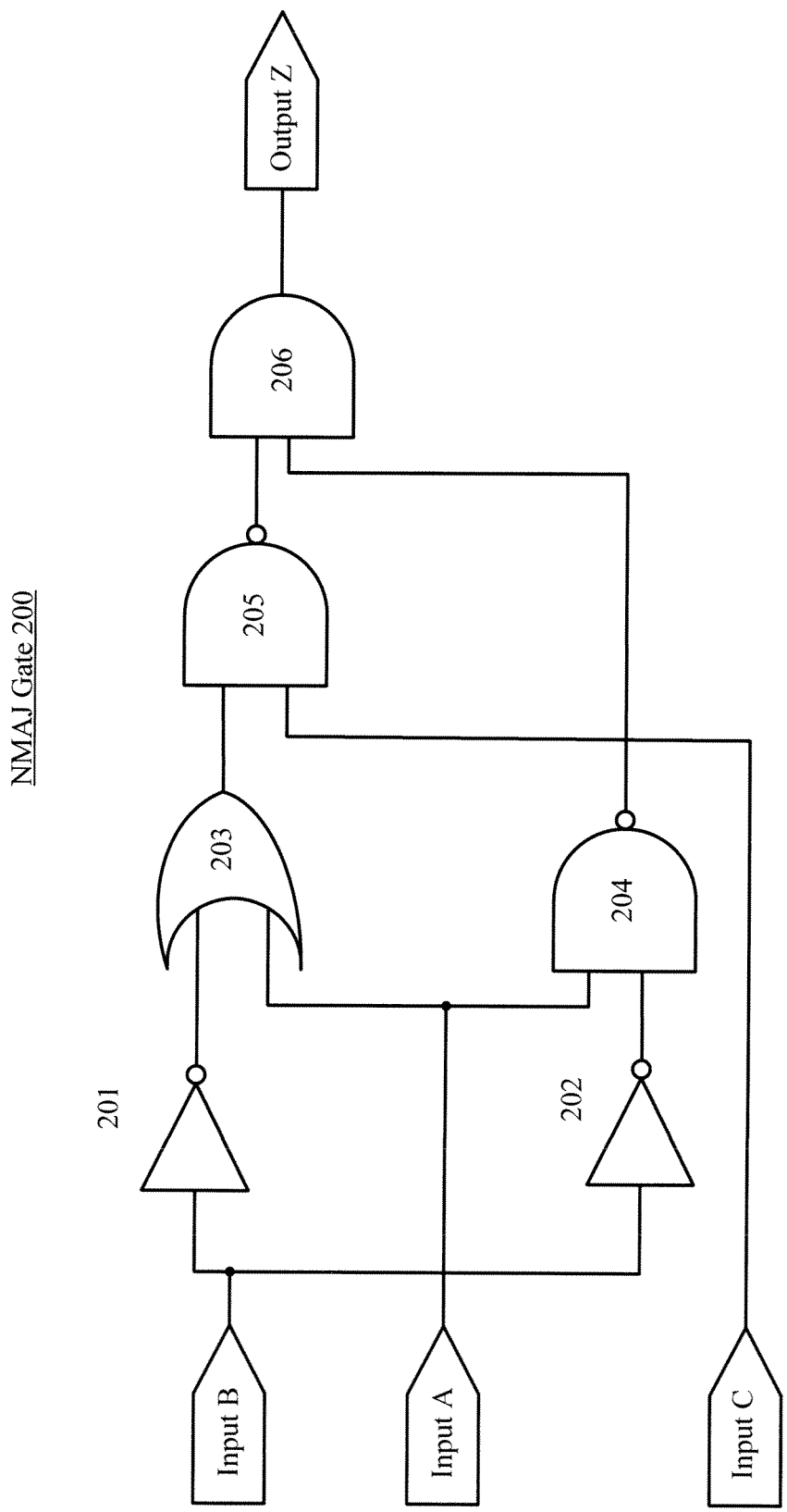
FIG. 2 illustrates another exemplary inverting majority gate.

FIG. 2 illustrates another exemplary NMAJ gate 200 (form "Y"), which is built out of two inverter library cells 201 and 202, two inverted AND (NAND) library cells 204 and 205, an AND library cell 206, and an OR library cell 203. Once again, the top-level inputs A, B, C and the top-level output Z are for illustration only and not part of the real design. Note that input B is inverted when computing the NMAJ function (equivalent to an NMAJ gate with inputs A and C inverted).

Figure 3:
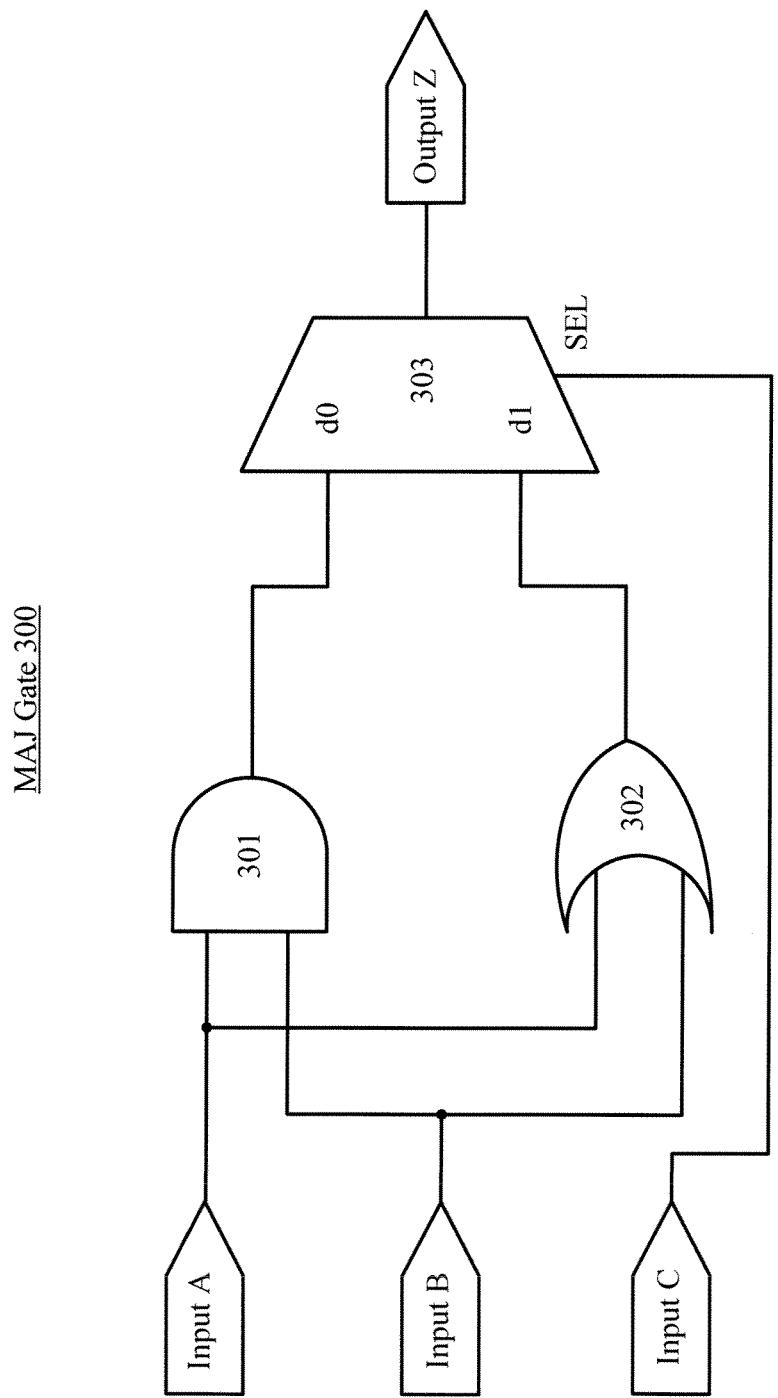
FIG. 3 illustrates an exemplary non-inverting majority gate.

FIG. 3 illustrates an exemplary MAJ gate 300 (form "ZZ"), which is built out of an AND library cell 301, an OR library cell 302 and a multiplexer (MUX) library cell 303. Once again, the top-level inputs A, B, C and the top-level output Z are for illustration only and not part of the real design. Note that MAJ gate 300 has one top-level input C that is used for control (SEL) rather than data propagation.

For commercial applications, majority gates in an IC design should be identified with negligible CPU time and memory overhead. However, this task can be complicated by possible input inversions and additional fanout connections (not shown in FIGS. 1-3). For example referring back to FIG. 2, because input A is not a real primary input in the design, but instead some arbitrary internal node, input A may be inverted before connecting to cells 203 and 204. Moreover, one or more cells may have other fanout connections, e.g. cell 204 could have one or more additional output connections. In one embodiment, a majority gate has no internal fanout and at least two of its input gates have the same inversion (shown also in TABLE 1).

Figures 4A, 4B:
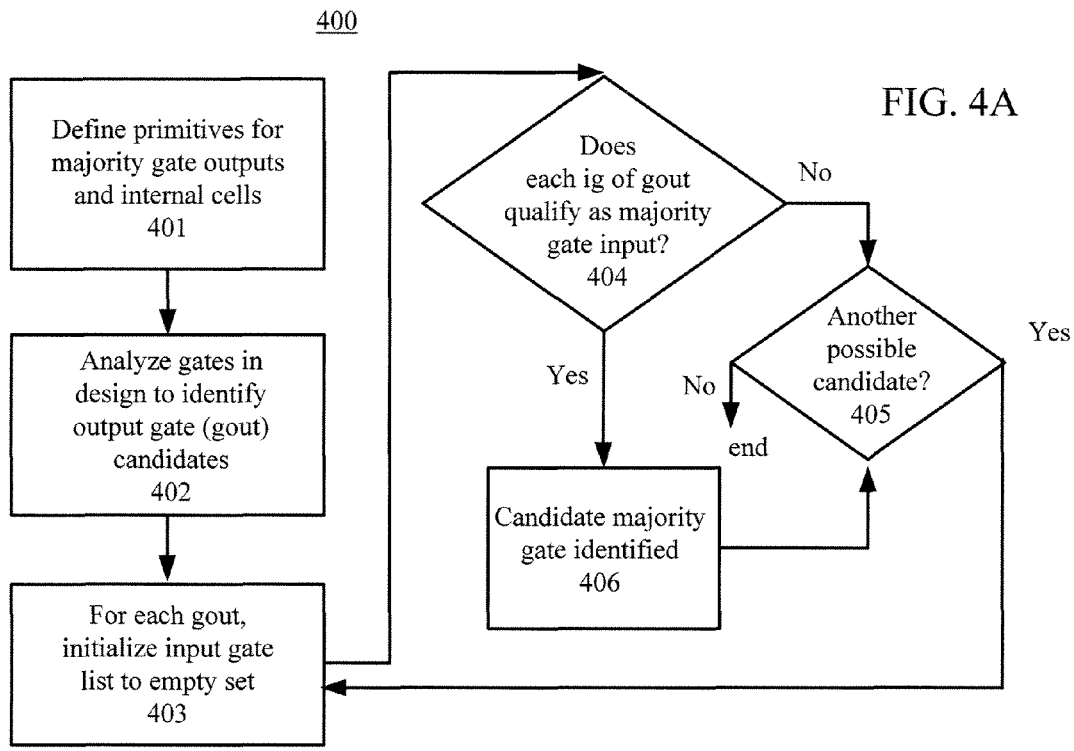
FIG. 4A illustrates an exemplary technique to identify a candidate majority gate.
FIG. 4B illustrates exemplary pseudo code that can implement the technique of FIG. 4A.

FIG. 4A illustrates an exemplary technique 400 to identify a candidate majority gate having four gates {i1,i2,i3,gout}, wherein i1, i2, i3 are input gates and gout is an associated output gate. FIG. 4B illustrates exemplary pseudo code 410 that can implement technique 400 of FIG. 4A, wherein steps of technique 400 are indicated in parentheses. In step 401 of technique 400, the set of library primitives that may be connected to majority gate output gates can be defined. An exemplary set Otype can be defined as:

Otype={AND,NAND,OR,NOR,XOR,XNOR,MUX}

Step 401 can also define the set of library primitives (cells) that may be internal to a majority gate. An exemplary set INTtype can be defined as:

INTtype={BUF,INV}∪Otype

In step 402, the IC design can be analyzed to identify output gate candidates. In one embodiment, a candidate output gate, gout, is any gate type in set Otype. In step 403, for each gout, an input gate list can be initialized to an empty set ({i1,i2,i3}={ }). Step 404 can determine whether each input gate ig of a possible candidate majority gate (i.e. associated with one gout) qualifies as a majority gate input. In one embodiment, the input gate qualifies as a majority gate input when (1) the input gate has a fanout >1, (2) the input gate is of a type not in INType, or (3) adding inputs would result in more than 3 unique inputs. With respect to (3), note that a candidate majority gate is identified and added to the set of inputs/output {i1,i2,i3,gout} (step 406) if and only if the direct and recursive analysis of the input gates of their associated gout yield exactly 3 unique input gates. When the input gate does not qualify as a majority gate input, then step 405 determines whether another gout (and thus another possible candidate majority gate) is present. If so, then technique 400 returns to step 403. If another possible candidate majority gate is not present, then technique 400 ends (i.e. all candidate majority gates in the design have been identified).

To provide yet further detail regarding technique 400 and code 410, reference is made to FIG. 2. Specifically, cell 206 in FIG. 2 would be designated a gout candidate at step 403. A first input of cell 206 is cell 205, which falls into the "else clause" in code 410 in step 404 (and therefore is not an input gate of a majority gate). However, a first input of cell 205 is input C, which can be defined as an input gate according to step 404. The other input of cell 205 is cell 203, which after recursive analysis (tracing any cells upstream in the circuit), eventually yields inputs A and B, which can be defined as input gates (both having fanouts greater than 1) (and noting that cell 201 is an inverter, which is characterized as part of set INTtype). A second input of cell 206 is cell 204, whose inputs are already in the input_list (i.e. both inputs A and B (via cell 202, which is characterized as part of set INTtype) can be input gates). Because the definitions for both the output gate and its associated inputs gates are met (and the direct and recursive analysis of the input gates of their associated gout yield exactly 3 unique input gates), the circuit of FIG. 2 can be identified as a candidate majority gate in step 406. Note that one gate may be both an input gate of a majority gate and an output gate of another majority gate (described below as a cascaded majority gate).

Figures 5A, 5B:
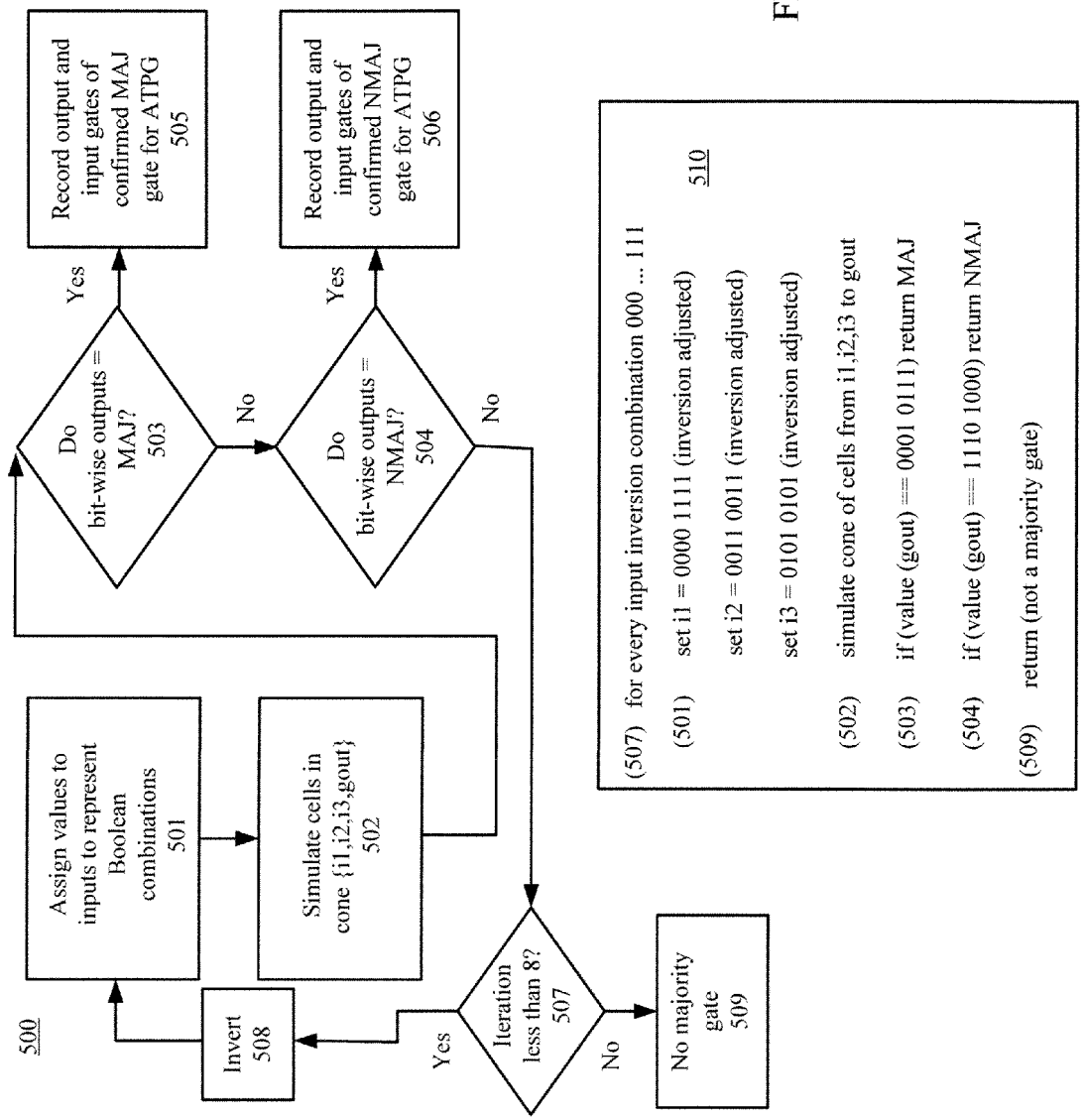
FIG. 5A illustrates an exemplary technique to check a candidate majority gate.
FIG. 5B illustrates exemplary pseudo code that can implement the technique of FIG. 5A.

Once identified, a candidate majority gate {i1,i2,i3,gout} can be checked to (1) confirm it is a majority gate and (2) determine its type (i.e. MAJ or NMAJ). This checking can be done by simulating all Boolean input combinations and inspecting the resulting output values. FIG. 5A illustrates an exemplary technique 500 to check a candidate majority gate, as identified by technique 400. FIG. 5B illustrates exemplary pseudo code 510 that can implement technique 500 of FIG. 5A, wherein steps of technique 500 are indicated in parentheses.

In step 501 of technique 500, bit values can be assigned to represent possible Boolean combinations of the input gates. In this embodiment of code 510, a first input gate i1 can be assigned bits "0000 1111", a second input gate i2 can be assigned bits "0011 0011", and a third input gate i3 can be assigned bits "0101 0101". If, for instance, input i1 is to be inverted, it would be assigned "1111 0000" instead (see also description of iterations below). For efficiency in step 502, only cells in the "cone", i.e. cells within cone defined from i1,i2,i3 to gout, are simulated. Note that the bit values assigned to input gates i1,i2,i3 in step 501 can advantageously represent all 8 ($2^3$=8) possible Boolean combinations. In one embodiment, for further speedup, all 8 input combinations can be simulated in parallel using established parallel-pattern simulation techniques which exploit the hardware parallelism of the machine word (which is at least 32 bits).

Steps 503 and 504 can check for the bit-wise outputs corresponding to MAJ and NMAJ gates, respectively. If a MAJ gate is found (bit-wise outputs=0001 0111) in step 503, then its output and input gates (and inversion, if any) are recorded for later use by ATPG in step 505. If a NMAJ gate is found (bit-wise outputs=1110 1000) in step 504, then its output and input gates (and inversion, if any) are recorded for later use by ATPG in step 506.

In one embodiment, when the three sets of assigned values (i1,i2,i3) do not result in bit-wise outputs corresponding to MAJ or NMAJ gates, then one or more sets of assigned values can be inverted. For example, in one embodiment, the first iteration of the "for" loop in code 510 can assign the input values indicated in step 501 of code 510. However, when steps 503 and 504 fail to find a MAJ gate or a gate, then the second iteration can invert the values for the first input gate, thus setting the set of i1 to 1111 0000. The third iteration can invert the values for the second input gate i2, the fourth iteration can invert the values for the first and second input gates i1 and i2, and so on. In one embodiment, step 507 determines whether the iteration number of the inversion (step 508) is less than 8. If none of the possible 8 iterations of the "for" loop matches either the MAJ or NMAJ gate output (shown in code 510) as determined in step 507, then the candidate majority gate is not really a majority gate, which is noted in step 509.

Note that ATPG is fundamentally a backtracking process. That is, to ensure a predetermined value on a target node, the process backtracks through the circuit design trying to find a way to set inputs and scan cells to achieve the predetermined value on the target node. The list of nodes used in backtracking is called a frontier. This frontier is constantly changing based on assumed values for various nodes in the list. Backtracking pushes upstream in the circuit design until a solution is found. Finding solutions for the target nodes of the circuit design is called justifying node values.

The circuitry inside a majority gate can complicate test generation due to the reconvergence effects. Because of the relatively simple behavior of the majority gate, it is much more efficient for sensitization and justification to exploit the functional behavior instead of just using the structural behavior. In accordance with an improved test generation technique, a structural analysis can be performed to identify circuit segments that perform the majority gate function (or its complement). As noted in steps 505 and 506 (FIG. 5A), the input and output gates for each majority gate can be stored along with any associated invertion information. Advantageously, the simulation model with majority gates is unchanged and still supports all normal fault modeling ability including faults interior to majority gates.

To sensitize a fault through an input of a majority gate to its output when the fault effect does not effect the other two (non-path) inputs, the two non-path inputs need only be placed at opposite values (adjusted for inversions). For example, referring to FIG. 3, to sensitize a fault through input A to output Z, inputs B and C must be at opposite values (e.g. B=0, C=1). Using this sensitization condition instead of normal structural considerations avoids the sensitization fanout decision associated with the majority gate reconvergence and optimizes the justification of sensitizing the fault effect through the majority gate. If one of the non-path inputs is already assigned, then the other non-path can be immediately assigned to the opposite value and the sensitization can continue forward from the majority gate output.

If both non-path inputs are unassigned, then a 2-choice XOR decision can be created to satisfy this requirement. If each of these inputs is controlled by a single scan cell, this XOR decision can be treated as a "headline" to further improve test generation and compression. Headlines were introduced as part of the FAN (Fan-Out Oriented) algorithm. This algorithm is described in an IEEE publication entitled, "On the Acceleration of Test Generation Algorithms", IEEE Trans. on Industrial Electronics, Vol. 36, No. 2, which was published in 1989. The FAN algorithm, which is well known to those skilled in the art of ATPG, teaches characterizing decision nodes of a circuit to speed up test generation. As defined in the FAN algorithm, decision nodes downstream from a fanout point are characterized as "bound", otherwise they are "free". A headline is a free node immediately preceding (i.e. immediately upstream to) a bound node. Note that a scan cell is considered a boundary point in the FAN algorithm and therefore any output of a scan cell is characterized as free. Note further that for simplicity in test industry terminology a logic gate having an output characterized as a headline can also be called a headline. Headlines (and an improved type of headline, called xheadlines) are described in U.S. Patent Publication 2011/0231805, entitled "Increasing PRPG-Based Compression By Delayed Justification, which was published on Sep. 22, 2011. Notably, during test generation, whenever a gate assignment results in any input associated with a majority gate decision being set to a binary value, the available choices for the decisions can be reevaluated and necessary assignments can be made.

Figure 6:
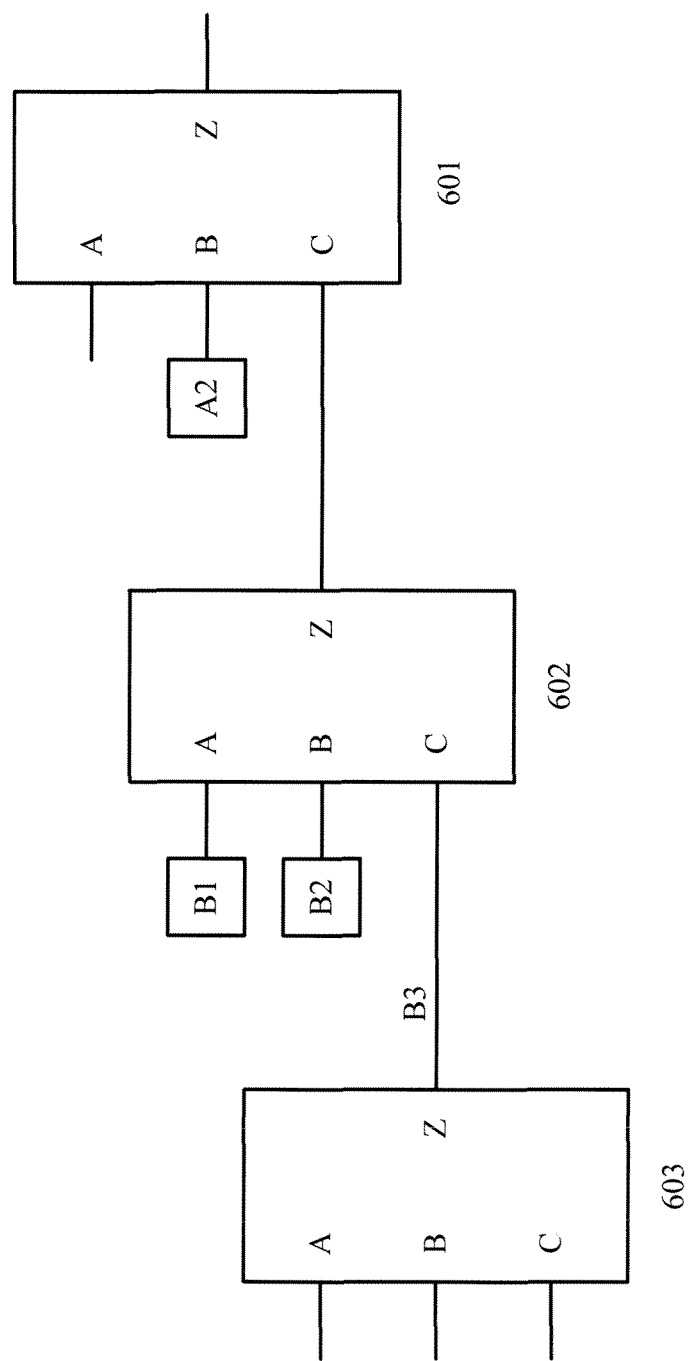
FIG. 6 illustrates an exemplary cascaded majority gate.

In one embodiment, majority gates that are cascaded can also be identified to improve test generation. A cascaded majority gate is a majority gate that has one (and only one) of its inputs directly connected to another majority gate. FIG. 6 illustrates exemplary cascaded majority gates 600 including majority gates 601, 602, and 603.

When sensitizing a fault through an input A of a cascaded majority gate 601 to its output Z and the fault effect does not effect the other two inputs B, C and one of the non-path inputs (input C) connects to another cascaded majority gate (602), there are additional opportunities to improve test generation efficiency. Specifically, if one of the non-path inputs is already assigned, then the other non-path input can be assigned to the opposite value and the sensitization can continue forward from the majority gate output as previously described. If both non-path inputs (inputs B and C of 601) are unassigned, then a "3-choice complement" majority gate decision can be created to satisfy this requirement.

Exemplary 3-choice decisions can be either "3-choice complement" or "3-choice equivalent" decisions. These decisions are associated with a cascaded majority gate, i.e. a source-sink pair (e.g. 602 and 601). In accordance with one aspect of sensitizing a fault through a cascaded majority gate, one of the three choices (described below) can be used.

A first choice can include setting the gates driving the non-majority inputs of the source majority gate (e.g. B1 and B2 driving inputs A and B of 602) to the same value. Thus, output Z of 602 has the same value as B1 and B2. Additionally, the gate driving the non-path, non-majority input of the sink majority gate (e.g. A2 driving input B of 601) is set to the complement (or same if "3-choice equivalent") of B1. Of the three choices, this first choice tends to be the most efficient because it is easy to satisfy (e.g. avoids assignments on 603, another majority gate) and has the best opportunity to be a XOR headline decision. Actual values assigned to A2, B1, and B2 can be adjusted to reflect any inversion effects. For instance, if B1 and B2 have different inversions, then values placed on B1 and B2 must be opposite instead of the same.

A second choice can include setting B1 and B3 to the same value. Thus, output Z of 602 has the same value as B1 and B3. Additionally, A2 is set to the complement (or same if "3-choice equivalent") of B1. If B3 is connected to another cascaded majority gate (603), another "3-choice equivalent" decision can be created to satisfy the condition of B1 and B3 being set to the same value, with 603 being the sink of the pair. Once again, actual values assigned to A2, B1, and B3 can be adjusted to reflect any inversion effect.

A third choice can include setting B2 and B3 to the same value. Thus, output Z of 602 has the same value as B2 and B3. Additionally, A2 is set to the complement (or same if "3-choice equivalent") of B2. If B3 is connected to another cascaded majority gate (603), another "3-choice equivalent" decision can be created to satisfy the condition of B2 and B3 being set to the same value. Once again, actual values assigned to A2, B2, and B3 are adjusted to reflect any inversion effects.

As noted above, sensitizing a fault through an input of a cascaded majority gate spawns one or more of the above-described 3-choice decisions, i.e. the "3-choice complement" decision and/or the "3-choice equivalent" decision. Each 3-choice decision can also spawn traditional justification decisions and headlines, which are known to those skilled in the art of test generation and therefore are not described in detail. In one embodiment, a 3-choice complement is used first to minimize additional decisions. This 3-choice complement, if necessary, can be expanded into a 3-choice equivalent, which in turn can be expanded into another 3-choice complement, etc.

Notably, majority gates are solely employed to guide test generation sensitization, while still covering all search space, with no loss of low-level faults. For instance, in FIG. 2, faults internal to the majority gate, such as faults on the inputs and output of gate 205, are handled by traditional ATPG, until the fault effect is propagated to output Z. Thereafter, fault sensitization can be guided by majority gates information. For instance, if A Gate 200 is gate 602 in FIG. 6, then the fault effect will next be sensitized through input C of majority gate 601. Justification decisions do not use majority gates (but can be created in the process of satisfying majority gases decisions).

Figure 7:
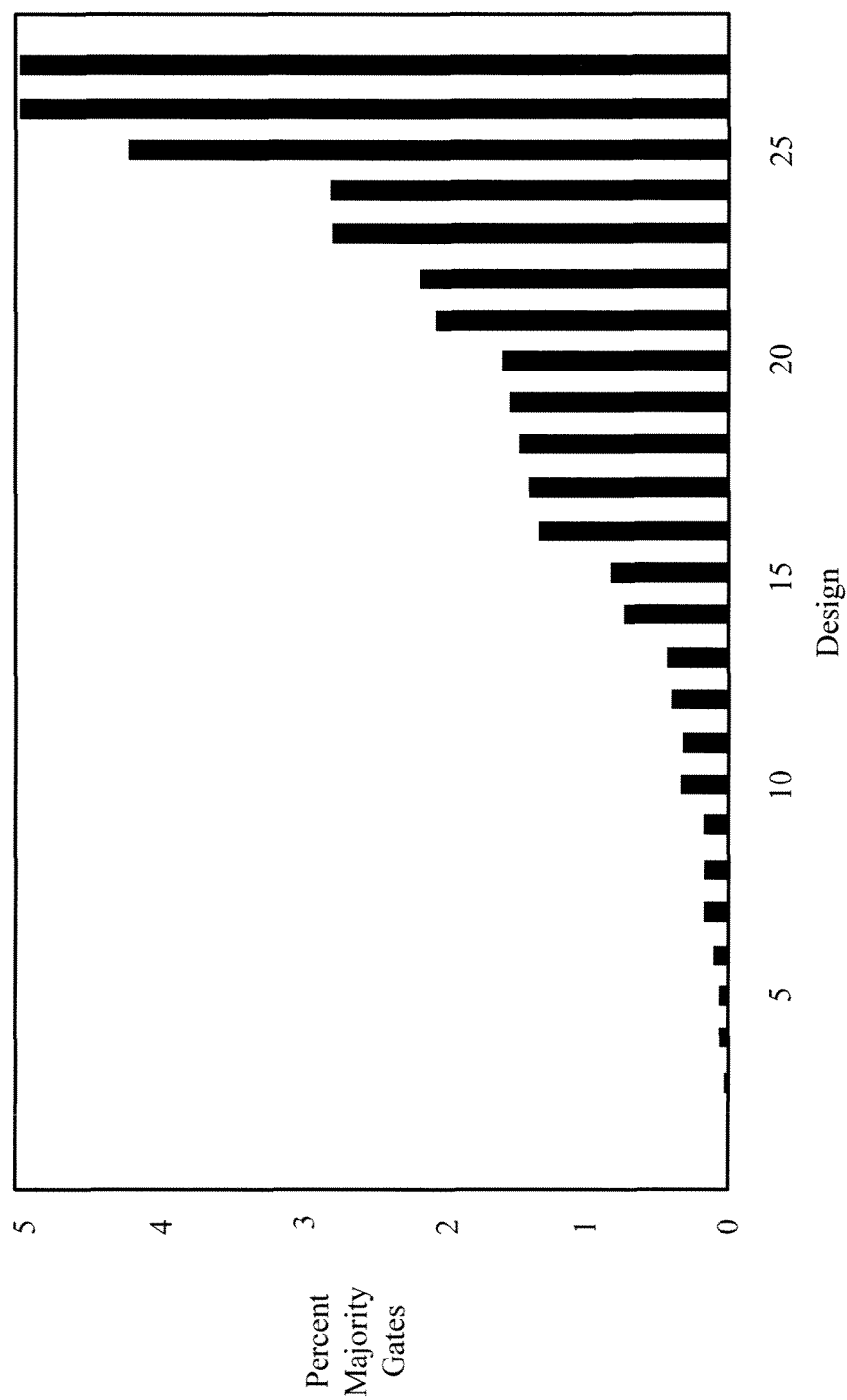
FIG. 7 is a graph providing metadata on various industrial designs, ranging from a few hundred thousand gates to multiple million gates, and their respective percentage of majority gates.

FIG. 7 is a graph providing metadata on 27 actual industrial designs, ranging from a few hundred thousand gates to multiple million gates, and their respective percentage of majority gates (number of majority gate structures vs. total number of gates). Seven of these designs (26%) have at least 2% majority gates. In general, state the art and/or larger designs have more majority gates than other designs.

Notably, the CPU time to identify candidate majority gates, check for majority gates, and sensitizing faults through a design based on majority gates is on the order of seconds for even the largest designs. Moreover, majority gate ATPG can also reduce pattern count.

To appreciate this ATPG performance aspect, assume a small test case consists of 512 cascaded majority gates of alternating form X (FIG. 1) and form Y (FIG. 2) with the non-cascaded inputs connected to scan cells. Further assume that majority gates are 5.5% of the total gates. ATPG results with and without majority gate identification and usage are presented in TABLE 2 for stuck-at and transition faults. Note that the test coverage was 100% in both cases. However, enabling majority gates ATPG reduced the pattern count to approximately half for both fault models.

TABLE 2

Cascaded majority gates alternating type X, Y

|  | Stuck-at-Faults | | Transition Faults | |
| --- | --- | --- | --- | --- |
|  | No MAJ | With MAJ | No MAJ | With MALT |
| Test coverage | 100% | 100% | 100% | 100% |
| # patterns | 1969 | 1041 | 2008 | 1056 |

Another small test case consists of 512 cascaded majority gates of alternating form Y (FIG. 2) and form ZZ (FIG. 3), with the non-cascaded inputs connected to scan cells. Assume that majority gates are 5.8% of the total gates in this test case. ATPG results are presented in TABLE 3. Note that the MUX structure can pose significant challenge to standard ATPG with only 4% coverage was achieved. However, when using majority gates, full 100% coverage was achieved for both stuck-at and transition faults.

TABLE 3

Cascaded majority gates alternating type Y, ZZ

|  | Stuck-at-Faults | | Transition Faults | |
| --- | --- | --- | --- | --- |
|  | No MAJ | With MAJ | No MAJ | With MAJ |
| Test coverage | 4% | 100% | 4% | 100% |
| # patterns | 84 | 1076 | 113 | 1604 |

Figure 8:
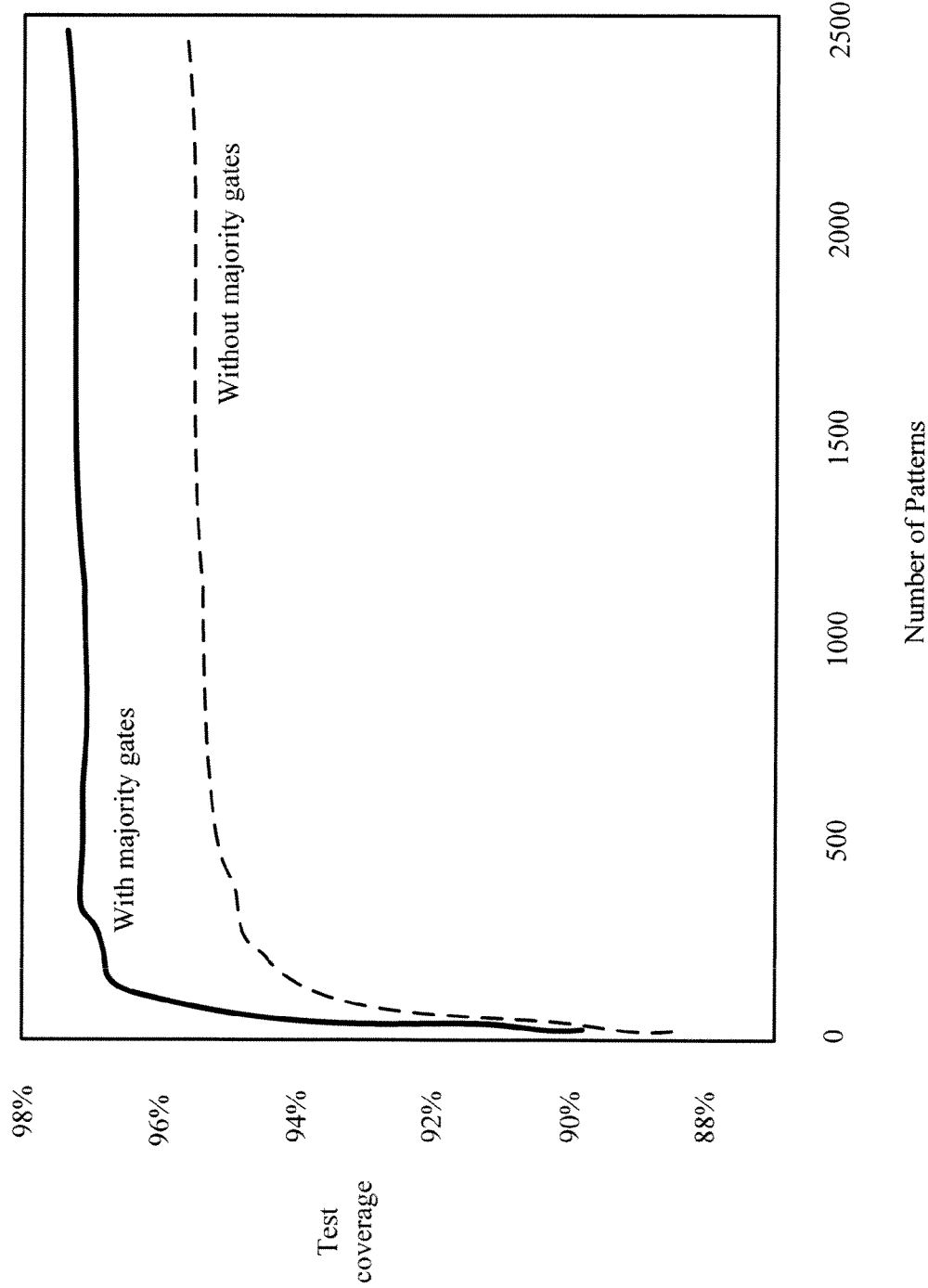
FIG. 8 is a graph plotting test coverage versus number of patterns for a large industrial design, thereby showing the increase of test coverage with pattern count during the ATPG process.

A large industrial design including 6 million gates was also analyzed to determine ATPG performance with and without majority gate identification and usage. In this case, PRPG-based compression was used and the design had 5% majority gates (which were identified in less than a second of CPU time). FIG. 8 is a graph plotting test coverage versus number of patterns for this design, thereby showing the increase of test coverage with pattern count during the ATPG process. The ATPG run using majority gates quickly increases to about 2% higher coverage at the same pattern count and ends with 2.5% higher coverage than the standard ATPG run without majority gates. Note that in a large design, this is a significant increase in coverage. When using the standard ATPG (without majority gates), the faults are so complex they exceed 10,000 test generation decisions, thereby resulting in aborted decisions. In contrast, when using majority gate ATPG, there are fewer and simpler decisions and therefore most decisions can be tested.

Figure 9:
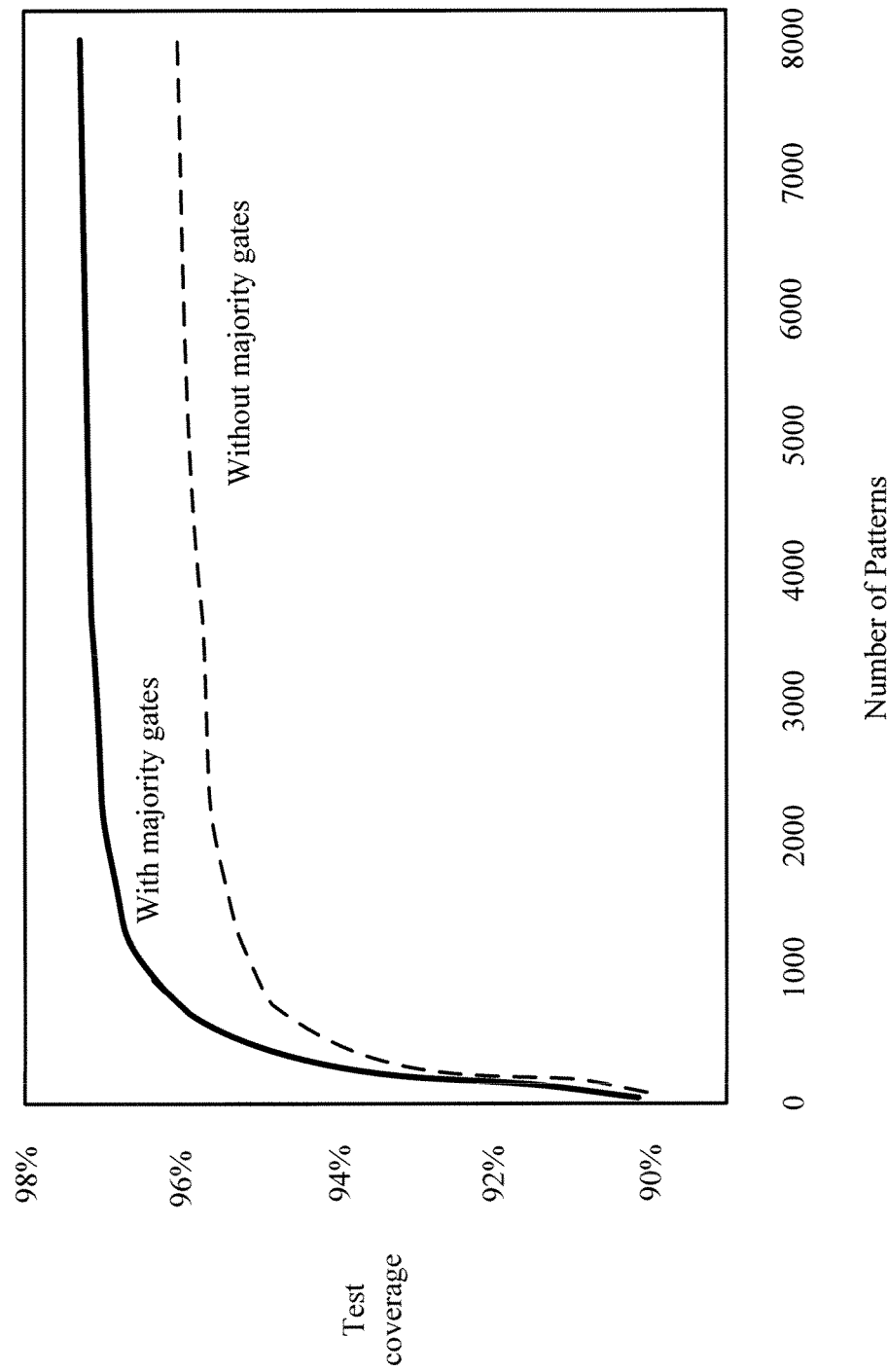
FIG. 9 is a graph plotting test coverage versus number of patterns for a very large industrial design, thereby showing the increase of test coverage with pattern count during the ATPG process.

An even larger industrial design including 40 million gates was also analyzed to determine ATPG performance with and without majority gate identification and usage. In this case, PRPG-based compression was used and the design had 5.2% majority gates (which were identified in approximately 3 seconds of CPU time, using a 4-core CPU). FIG. 9 is a graph plotting test coverage versus number of patterns for this design, thereby showing the increase of test coverage with pattern count during the ATPG process. As before, the ATPG run using majority gates has significantly higher coverage than the ATPG run without majority gates at the same pattern count and ends with 1.3% higher coverage. Once again, the differential is due to the large number of faults that exceed 10,000 test generation decisions and are therefore aborted in standard ATPG, but are tested when using majority gates ATPG.

Figure 10:
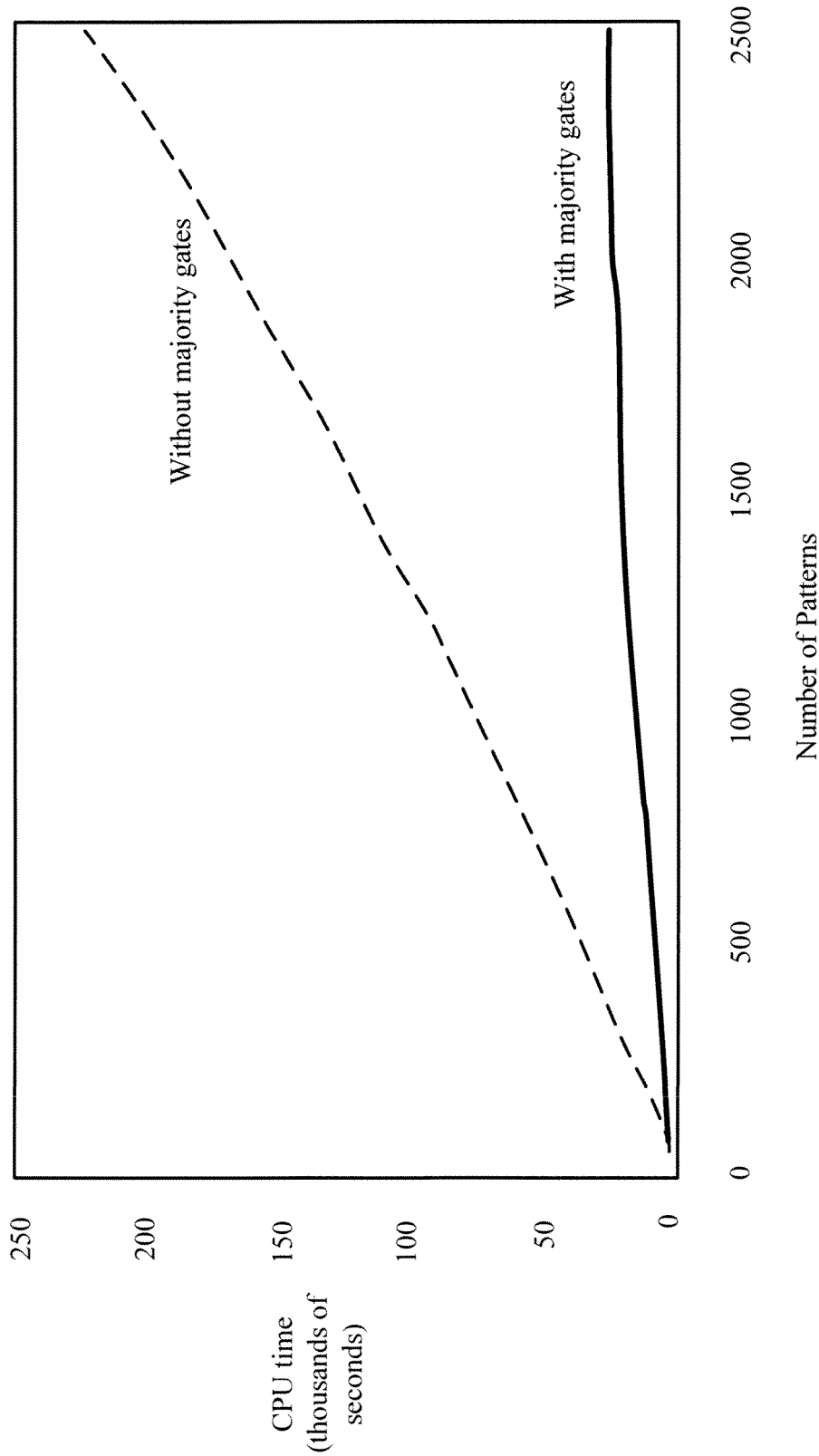
FIGS. 10 and 11 are graphs plotting CPU time versus number of patterns.
Figure 11:
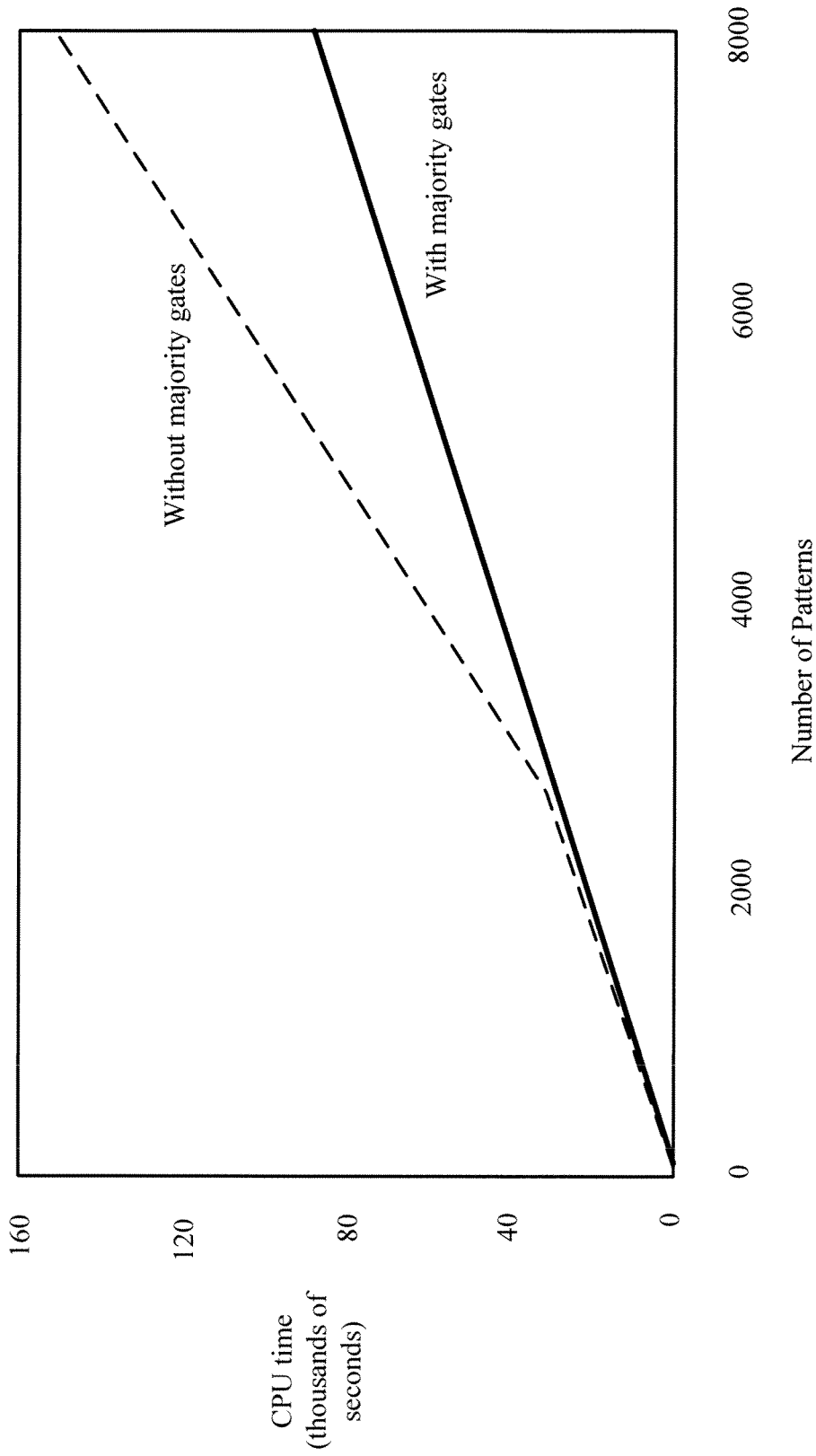

In addition to higher coverage, majority gates ATPG also provides a significant performance advantage. For example, FIGS. 10 and 11 are graphs plotting CPU time versus number of patterns. The designs for FIGS. 10 and 11 are 6 million gates and 40 million gates, respectively. As shown in both FIGS. 10 and 11, majority gate ATPG generates the same number of patterns much faster than standard ATPG.

FIG. 12 illustrates an exemplary technique 1200 to improve the performance of a tester, which is configured to test an IC design. Step 1201 can identify candidate majority gates of the design. As indicated above, each candidate majority gate includes a plurality of library cells and has an odd number of inputs and one output, wherein the one output has a Boolean value of a majority of the inputs. In step 1202, for each identified candidate majority gate, the output can be simulated based on predetermined bit values assigned to the inputs and propagated through the plurality of library cells. This simulating can determine whether the identified candidate majority gate is a confirmed majority gate. Step 1203 can modify ATPG of the tester based on the confirmed majority gates. This modification can make more efficient fault sensitization decisions. As indicated above, results demonstrate that test coverage, pattern count, and CPU time can be significantly improved using technique 1200. Advantageously, technique 1200 can advantageously guide test generation decisions while not affecting fault management, simulation, or diagnosis. Technique 1200 can reduce the number of care bits needed to test faults, and therefore is particularly effective in scan-compression designs which have a limited bandwidth of care bits per pattern.

Figure 13:
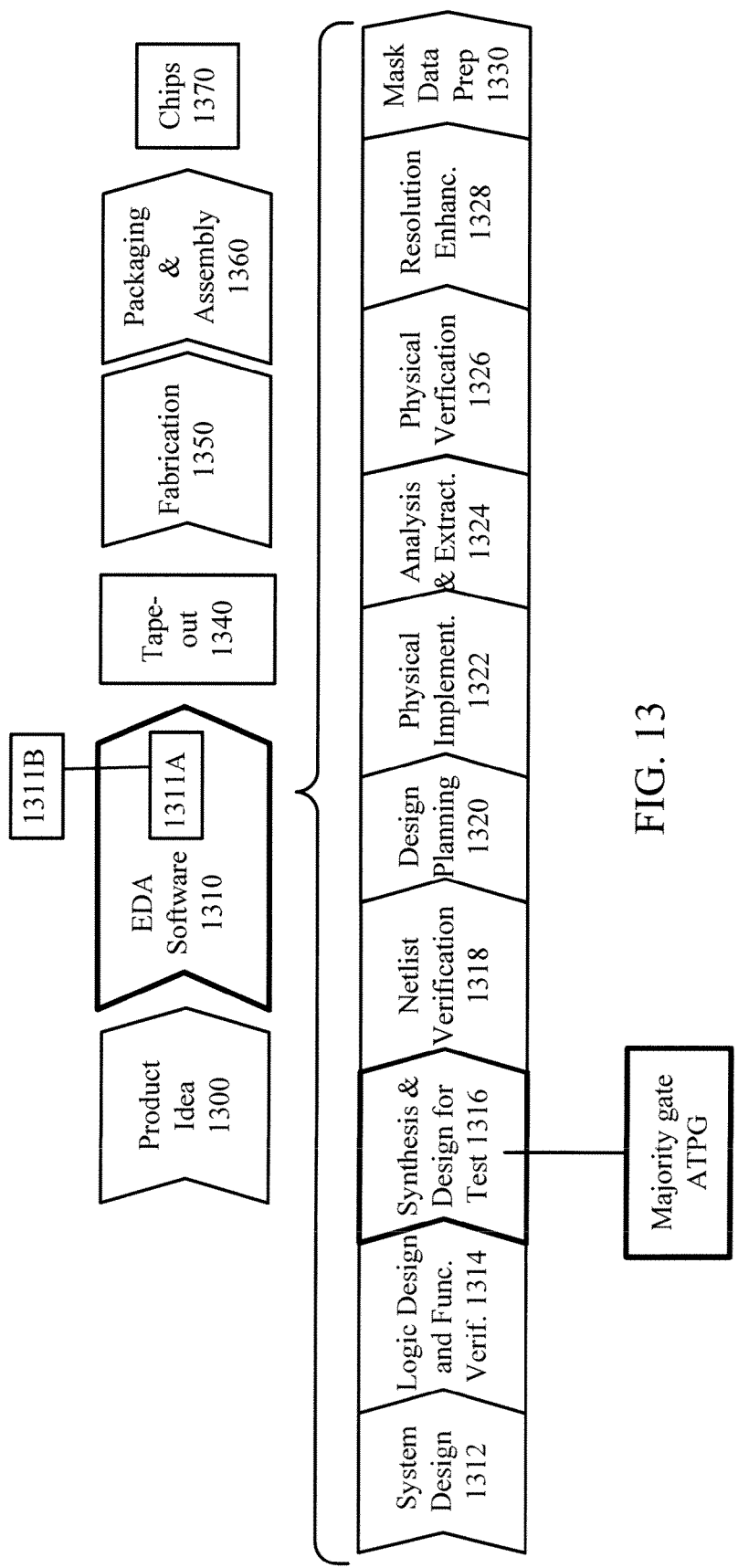
FIG. 13 shows a simplified representation of an exemplary digital ASIC design flow including majority gate ATPG.

FIG. 13 shows a simplified representation of an exemplary digital ASIC design flow including majority gate ATPG (summarized in technique 1200). At a high level, the process starts with the product idea (step 1300) and is realized in an EDA software design process (step 1310). When the design is finalized, it can be taped-out (event 1340). After tape out, the fabrication process (step 1350) and packaging and assembly processes (step 1360) occur resulting, ultimately, in finished chips (result 1370).

The EDA software design process (step 1310) is actually composed of a number of steps 1312-1330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1310) will now be provided. In one embodiment, one or more steps of the EDA software design process can be implemented using a computer-readable medium 1311A, which is read by a computer 1311B. Note that Astro, AstroRail, CustomSim, DFTMAX Ultra, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 1312): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 1314): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 1316): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, DFTMAX Ultra™, and DesignWare® products. The majority gate ATPG technique described above can be advantageously used in step 1316.

Netlist verification (step 1318): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1320): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1322): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1324): At this step, the circuit function is verified at a transistor level, this in turn permits what-if refinement. Exemplary EDA software products from Synopsys, Inc. that can be used at this step include AstroRail™, PrimeRail™, Primetime®, and Star RC/XT™ products.

Physical verification (step 1326): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 1328): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 1330): This step provides the "tape-out" data for production of masks for lithographic use to produce finished chips. Exemplary EDA software products from Synopsys, Inc. that can be used at this step include the CATS® family of products.

The majority gate ATPG method can be implemented in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. For example, in one embodiment, the sets of output (Otype) and internal (INTtype) (FIG. 4) can be modified to include other gate types, as appropriate for the design library being used. Note also that the 3-choice complement and the 3-choice equivalent decisions can be extended for any odd number input majority gates (e.g. 5-input majority gates, etc.). As such, many modifications and variations will be apparent. Accordingly, it is intended that the scope of the invention be defined by the following Claims and their equivalents.

We claim:

1. A method to increase automatic test pattern generation (ATPG) effectiveness when testing a design of an integrated circuit, the method comprising:

identifying candidate majority gates of the design, wherein each candidate majority gate includes a plurality of library cells and has an odd number of inputs and one output, wherein the one output has a Boolean value of a majority of the inputs;

using a computer, for each identified candidate majority gate, simulating the output based on predetermined bit values assigned to the inputs and propagated through the plurality of library cells, wherein the simulating determines whether the identified candidate majority gate is a confirmed majority gate; and modifying an ATPG based on confirmed majority gates.

2. The method of claim 1, wherein the identifying candidate majority gates includes:

defining predetermined library cells for majority gate outputs.

3. The method of claim 2, wherein the identifying candidate majority gates includes identifying possible candidate majority gates based on the predetermined library cells for majority gate outputs.

4. The method of claim 3, wherein the identifying possible candidate majority gates includes defining a set of output gate (Otype) library cells consisting of {AND,NAND,OR,NOR,XOR,XNOR,MUX}.

5. The method of claim 4, wherein the identifying possible candidate majority gates includes defining a set of internal gate library cells (INTtype) consisting of {BUF, INV, Otype}.

6. The method of claim 5, wherein the identifying candidate majority gates includes:

for each possible candidate majority gate, determining whether at least one of the following is true:
an input gate has a fanout greater than one;
the input gate is not in INTtype; and
analysis of the possible candidate majority gate yields exactly N unique input gates, wherein N is an odd integer greater than one.

7. The method of claim 6, wherein the simulating the output includes recording whether the confirmed majority gate is a non-inverted majority gate.

8. The method of claim 7, wherein the simulating the output includes recording whether the confirmed majority gate is an inverted majority gate.

9. The method of claim 8, wherein the simulating the output includes:

determining that a first set of predetermined bit values do not confirm that the identified candidate majority gate is a confirmed majority gate; and inverting at least some of the first set of predetermined bit values and then re-simulating the output.

10. The method of claim 9, wherein the simulating the output includes:

re-simulating the output up to a predetermined number of iterations, wherein when neither a non-inverted majority gate nor an inverted majority gate is confirmed, then indicating that the identified candidate majority gate is not a majority gate.

11. The method of claim 1, wherein the modifying the ATPG includes sensitizing a fault through one input gate of the confirmed majority gate to the output.

12. The method of claim 11, wherein the modifying the ATPG includes placing non-path inputs at opposite values, the non-path inputs being any path input other than a path input associated with the fault.

13. The method of claim 1, wherein the confirmed majority gate is a cascaded majority gate, further including sensitizing a fault through one input gate of at least one majority gate to its output, the at least one majority gate forming part of the cascaded majority gate.

14. A non-transitory, computer-readable medium storing computer-executable instructions for improving testing of a design of an integrated circuit, which when executed by a computer perform steps comprising:

identifying candidate majority gates of the design, wherein each candidate majority gate includes a plurality of library cells and has an odd number of inputs and one output, wherein the one output has a Boolean value of a majority of the inputs;

for each identified candidate majority gate, simulating the output based on predetermined bit values assigned to the inputs and propagated through the plurality of library cells, wherein the simulating determines whether the identified candidate majority gate is a confirmed majority gate; and modifying an automatic test pattern generation (ATPG) based on confirmed majority gates.

15. The computer-readable medium of claim 14, wherein the identifying candidate majority gates includes:

defining predetermined library cells for majority gate outputs.

16. The computer-readable medium of claim 15, wherein the identifying candidate majority gates includes:

identifying possible candidate majority gates based on the predetermined library cells for majority gate outputs.

17. The computer-readable medium of claim 16, wherein the identifying possible candidate majority gates includes defining a set of output gate (Otype) library cells consisting of {AND,NAND,OR,NOR,XOR,XNOR,MUX}.

18. The computer-readable medium of claim 17, wherein the identifying possible candidate majority gates includes defining a set of internal gate library cells (INTtype) consisting of {BUF,INV,Otype}.

19. The computer-readable medium of claim 18, wherein the identifying candidate majority gates includes:

for each possible candidate majority gate, determining whether at least one of the following is true:
an input gate has a fanout greater than one;
the input gate is not in INTtype; and
analysis of the possible candidate majority gate yields exactly N unique input gates, wherein N is an odd integer greater than one.

20. The computer-readable medium of claim 19, wherein the simulating the output includes recording whether the confirmed majority gate is a non-inverted majority gate.

21. The computer-readable medium of claim 20, wherein the simulating the output includes recording whether the confirmed majority gate is an inverted majority gate.

22. The computer-readable medium of claim 21, wherein the simulating the output includes:

determining that a first set of predetermined bit values do not confirm that the identified candidate majority gate is a confirmed majority gate; and inverting at least some of the first set of predetermined bit values and then re-simulating the output.

23. The computer-readable medium of claim 22, wherein the simulating the output includes:

re-simulating the output up to a predetermined number of iterations, wherein when neither a non-inverted majority gate nor an inverted majority gate is confirmed, then indicating that the identified candidate majority gate is not a majority gate.

24. The computer-readable medium of claim 14, wherein the modifying the ATPG includes sensitizing a fault through one input gate of the confirmed majority gate to the output.

25. The computer-readable medium of claim 24, wherein the modifying the ATPG includes placing non-path inputs at opposite values, the non-path inputs being any path input other than a path input associated with the fault.

26. The computer-readable medium of claim 14, wherein the confirmed majority gate is a cascaded majority gate, further including sensitizing a fault through one input of at least one majority gate to its output, the at least one majority gate forming part of the cascaded majority gate.

* * * * *